United States Patent
Kumagai et al.

(10) Patent No.: US 7,633,309 B2
(45) Date of Patent: Dec. 15, 2009

(54) INSPECTION METHOD, INSPECTION APPARATUS AND COMPUTER-READABLE STORAGE MEDIUM STORING PROGRAM FOR INSPECTING AN ELECTRICAL PROPERTY OF AN OBJECT

(75) Inventors: Yasunori Kumagai, Nirasaki (JP); Ka Toh, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 14 days.

(21) Appl. No.: 12/003,214

(22) Filed: Dec. 20, 2007

(65) Prior Publication Data

US 2008/0150562 A1    Jun. 26, 2008

(30) Foreign Application Priority Data

Dec. 25, 2006  (JP) .............................. 2006-348523

(51) Int. Cl.
*G01R 31/02* (2006.01)
(52) U.S. Cl. ......................... 324/765; 324/754; 324/761
(58) Field of Classification Search ........................ None
See application file for complete search history.

(56) References Cited

U.S. PATENT DOCUMENTS

| | | | | |
|---|---|---|---|---|
| 6,777,967 | B2 * | 8/2004 | Iino et al. .................... | 324/757 |
| 7,262,613 | B2 * | 8/2007 | Komatsu et al. ............ | 324/754 |
| 7,301,357 | B2 * | 11/2007 | Shinozaki et al. ........... | 324/757 |
| 2007/0063725 | A1 * | 3/2007 | Komatsu et al. ............ | 324/765 |

FOREIGN PATENT DOCUMENTS

| | | |
|---|---|---|
| JP | 2002-139542 | 5/2002 |
| JP | 2002-214295 | 7/2002 |
| JP | 2004-93451 | 3/2004 |
| JP | 2004-191208 | 7/2004 |

\* cited by examiner

*Primary Examiner*—Vinh P Nguyen
(74) *Attorney, Agent, or Firm*—Smith, Gambrell & Russell, LLP

(57) ABSTRACT

An inspection apparatus includes a fritting circuit applying a voltage between a probe pair composed of probes in pairs in contact with a substrate to cause a fritting phenomenon to establish electrical conduction between the probes and the substrate; and a switching circuit electrically connecting the probe pair and the flitting circuit and capable of freely switching between polarities of a voltage applied between the probe pair. Voltage is applied twice between the probe pair in contact with the substrate to thereby perform fritting twice. In the two times of fritting, the polarities of the voltage applied between the probe pair are changed.

8 Claims, 8 Drawing Sheets

FIG.4
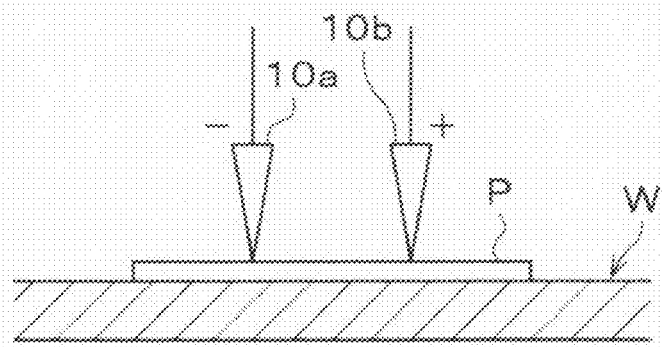
FIG.5
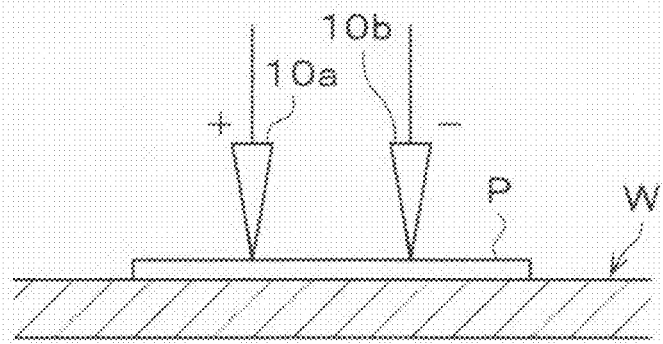
FIG.6
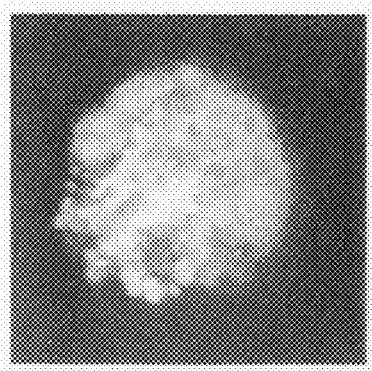 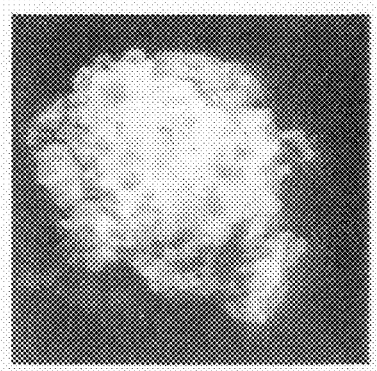
(a)                      (b)

FIG.7

| JUDGMENT OF QUALITY OF ELECTRICAL CONDUCTION | | FRITTING ONLY ONCE | | | FRITTING TWICE (WITHOUT CHANGING POLARITIES) | | | FRITTING TWICE (WITH POLARITIES BEING CHANGED) | | |
|---|---|---|---|---|---|---|---|---|---|---|
| FIRST TIME | SECOND TIME | I | II | III | I | II | III | I | II | III |
| × | ○ | 616 | 14 | 60 | 21 | 3 | 5 | 6 | 5 | 4 |
| × | × | 616 | 14 | 60 | 8 | 2 | 6 | 0 | 0 | 0 |

INSPECTION METHOD, INSPECTION APPARATUS AND COMPUTER-READABLE STORAGE MEDIUM STORING PROGRAM FOR INSPECTING AN ELECTRICAL PROPERTY OF AN OBJECT

BACKGROUND OF THE INVENTION

1. Field of the Invention

The present invention relates to an inspection method of inspecting an electrical property of an object to be inspected, an inspection apparatus performing the inspection method, and a storage medium storing a program for realizing the inspection method.

2. Description of the Related Art

Inspection of electrical properties of electronic circuits such as IC, LSI, and the like formed, for example, on a semiconductor wafer is performed using an inspection apparatus. The inspection apparatus has a probe card electrically connected to a tester, and many probes are attached to the lower surface of the probe card. The inspection of the electronic circuits is performed by bringing, for example, the probes into contact with electrodes of the electronic circuits on the wafer and causing an electrical signal to flow to the electrodes.

However, if an oxide film is formed on the electrode surface on the wafer, the electrical signal hardly flows to fail to appropriately perform the inspection. In addition, strongly pressing the probes against the electrode surface to establish an electrical conduction can break the probes and the electronic circuits. Therefore, it is proposed that a pair of probes composed of two probes in pairs (a probe pair) are brought into contact with the electrode with a low pressure and a voltage is applied between the probe pair before inspection to cause a fritting phenomenon to produce a dielectric breakdown on the electrode surface so as to establish a good electrical conduction between the probes and the electrode (hereinafter referred to as "fritting") (Japanese Patent No. 2002-139542, and JP No. 2004-191208).

Note that the fritting phenomenon refers to a phenomenon that a high potential gradient is applied to a metal surface having an oxide film formed thereon to cause a dielectric breakdown of the oxide film, so that current flows to the metal surface.

SUMMARY OF THE INVENTION

According to the inspection method using the above-described fritting, even when the probes are brought into contact with the electrode on the wafer with a low load, a good electrical conduction can be obtained between the probes and the electrode, and it is demanded to stably obtain good conduction between the probes and the electrode, for example, in order to further increase the reliability of inspection of the electrical property of the wafer.

The present invention has been developed in consideration of the above points and its object is to more stably obtain the electrical conduction between probes and an object to be inspected in inspection of the electrical property of the object to be inspected such as a wafer.

To achieve the above object, the present invention is an inspection method of inspecting an electrical property of an object to be inspected by bringing probes into contact with the object to be inspected, the method including a fritting step of bringing a probe pair composed of probes in pairs into contact with the object to be inspected and applying a voltage between the probe pair to cause a fritting phenomenon to establish an electrical conduction between at least one of the probe pair and the object to be inspected, wherein in the fritting step, a voltage is applied between the probe pair a plurality of times, and polarities of the voltage applied between the probe pair are alternately changed.

The inventors verified that bias in electrical conductivity between at least one of the probe pair and the object to be inspected occurs between the anode side and the cathode side of the probe pair between which a voltage is applied during fritting. According to the present invention, polarities of the voltage applied between the probe pair are alternately changed, whereby the bias in electrical conductivity between the anode side and the cathode side of the probe pair is resolved, resulting in high conductivity between both electrodes of the probe pair. As a result, high conductivity between the probe pair and the object to be inspected can be stably obtained.

The above inspection method may include, in the fritting step, a step of measuring an electrical conductivity between at least one of the probe pair and the object to be inspected after completion of an application of voltage between the probe pair, and when the measured electrical conductivity does not reach a previously set reference, a subsequent application of voltage between the probe pair may be performed with the polarities being changed.

The application of voltage the plurality of times between the probe pair may be performed such that the numbers of times of a positive polarity and a negative polarity are the same for each of the probes.

The present invention according to another aspect is an inspection apparatus inspecting an electrical property of an object to be inspected by bringing probes into contact with the object to be inspected, the apparatus including a fritting circuit applying a voltage between a probe pair composed of probes in pairs in contact with the object to be inspected to cause a fritting phenomenon to establish an electrical conduction between at least one of the probe pair and the object to be inspected; and a switching circuit electrically connecting the probe pair and the fritting circuit and capable of freely switching between polarities of a voltage applied between the probe pair.

The above inspection apparatus may further have a measuring circuit measuring an electrical conductivity between at least one of the probe pair and the object to be inspected using the probe pair.

According to another aspect, the present invention is a computer-readable storage medium storing a program running on a computer of a control unit controlling the inspection apparatus in order to allow the inspection apparatus to perform the above inspection method.

According to the present invention, high electrical conductivity between at least one of the probe pair and the object to be inspected can be stably obtained to improve the reliability of inspection of the electrical property.

BRIEF DESCRIPTION OF THE DRAWINGS

FIG. 4 is an explanatory view showing polarities of a pair of probes during a first fritting;

FIG. 5 is an explanatory view showing polarities of the pair of probes during a second fritting;

FIG. 6 (a) is an experimental photograph showing a state of a tip portion of the probe on the anode side when fritting are performed multiple times, and FIG. 6 (b) is an experimental photograph showing a state of a tip portion of the probe on the cathode side when fritting are performed multiple times;

FIG. 7 is a table showing the numbers of samples with good and poor electrical conductivities in the case where the fritting was performed only once, the case where the fritting was performed twice without changing the polarities, and the case where the fritting was performed twice with the polarities being changed;

DETAILED DESCRIPTION OF THE INVENTION

Figure 1:
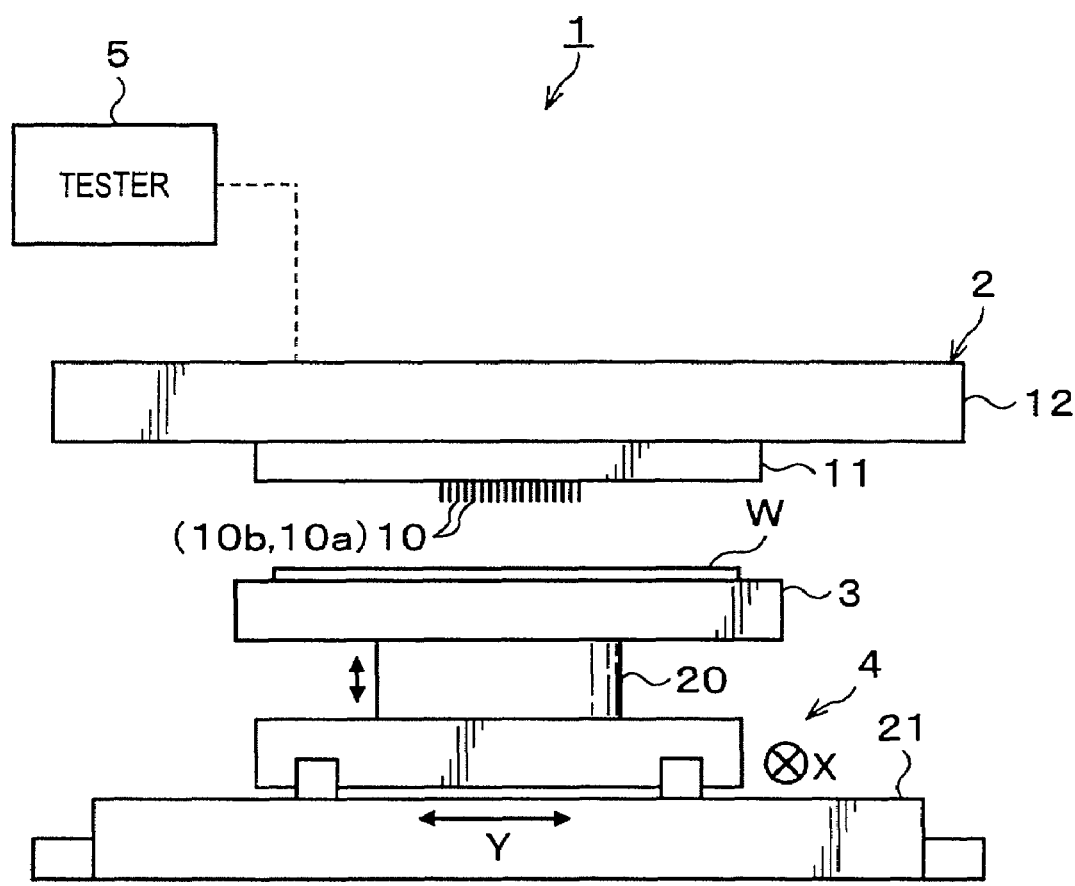
FIG. 1 is a side view showing the outline of a configuration of an inspection apparatus.

Hereinafter, a preferred embodiment of the present invention will be described. FIG. 1 is an explanatory view showing a configuration of an inspection apparatus 1 according to this embodiment.

The inspection apparatus 1 includes, for example, a probe card 2, a chuck 3 suction-holding a wafer W as an object to be inspected, a moving mechanism 4 moving the chuck 3, and a tester 5.

The probe card 2 includes a contactor supporting a plurality of probes 10 on its lower surface, and a printed circuit board 12 attached to the upper surface side of the contactor 11. Each of the probes 10 is electrically connected to the printed circuit board 12 via a main body of the contactor 11. To the probe card 2, the tester 5 is electrically connected so that the operation of the probe card 2 can be controlled by an electrical signal from the tester 5. The circuit configuration of the probe card 2 will be described later.

The chuck 3 is formed in an almost disk shape having a horizontal upper surface. The upper surface of the chuck 3 is formed with a not-shown suction port so that the wafer W can be suction-held on the chuck 3 by suction from the suction port.

The moving mechanism 4 includes, for example, a raising and lowering drive unit 20 such as a cylinder raising and lowering the chuck 3, and an X-Y stage 21 moving the raising and lowering drive unit 20 in two horizontal directions perpendicular to each other (an X-direction and a Y-direction). This allows the wafer W held on the chuck 3 to be moved in three dimensions so as to bring electrodes on the front surface of the wafer W into contact with the probes 10.

Figure 2:
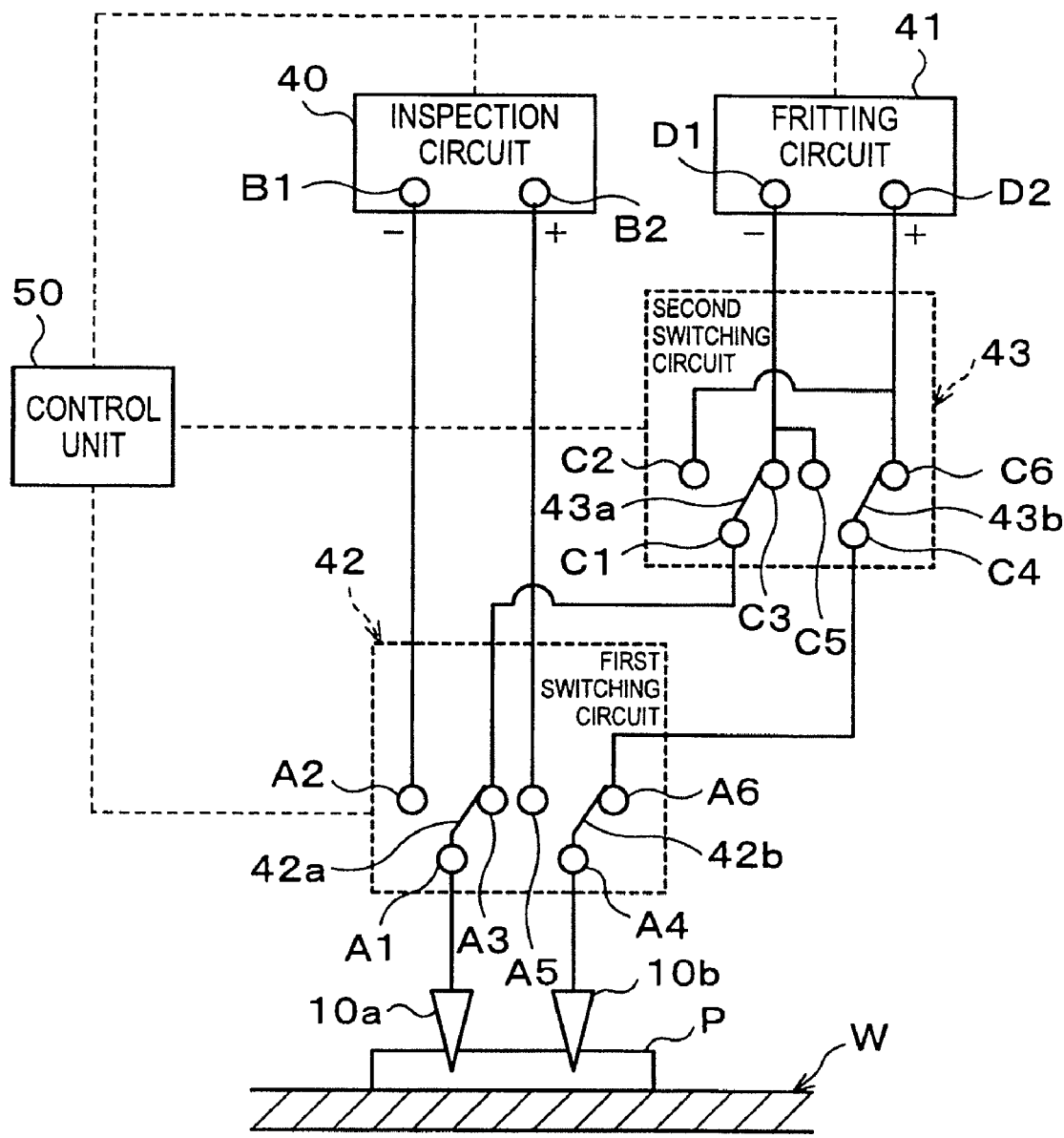
FIG. 2 is a schematic diagram showing an example of the circuit configuration of a probe card.

For example, the probe card 2 includes, as shown in FIG. 2, an inspection circuit 40 that transmits/receives an electrical signal for inspecting the electrical property to/from probes 10a and 10b in pairs, a fritting circuit 41 that applies a voltage to the pair of probes 10a and 10b to cause a fritting phenomenon, a first switching circuit 42 that switches between the connection of the inspection circuit 40 and the connection of the fritting circuit 41, to the pair of probes 10a and 10b, a second switching circuit 43 that switches between the polarities of the voltage applied between the pair of probes 10a and 10b from the fritting circuit 41, and so on.

The first switching circuit 42 includes, for example, a switching element 42a that switches between the connection between a terminal A1 connected to the probe 10a and a terminal A2 which is connected to a cathode terminal B1 of the inspection circuit 40 and the connection between the terminal A1 and a terminal A3 which is connected to a terminal D1 or D2 having an either polarity of the fritting circuit 41. The first switching circuit 42 also includes, for example, a switching element 42b that switches between the connection between a terminal A4 which is connected to the probe 10b and a terminal A5 which is connected to an anode terminal B2 of the inspection circuit 40 and the connection between the terminal A4 and a terminal A6 which is connected to the terminal D1 or D2 having an either polarity of the fritting circuit 41.

The second switching circuit 43 includes, for example, a switching element 43a that switches between the connection between a terminal C1 which is connected to the terminal A3 of the first switching circuit 42 and a terminal C2 which is connected to the anode terminal D2 of the fritting circuit 41 and the connection between the terminal C1 and a terminal C3 which is connected to the cathode terminal D1 of the fritting circuit 41. The second switching circuit 43 also includes, for example, a switching element 43b that switches between the connection between a terminal C4 which is connected to the terminal A6 of the first switching circuit 42 and a terminal C5 which is connected to the cathode terminal D1 of the fritting circuit and the connection between the terminal C4 and a terminal C6 which is connected to anode terminal D2 of the fritting circuit 41.

The tester 5 is provided with a control unit 50 that controls, for example, the operations of the inspection circuit 40, the fritting circuit 41, the first switching circuit 42m and the second switching circuit 43. The control unit 50 is composed of a computer including, for example, a CPU and a memory and can execute, for example, programs stored in the memory to thereby realize the inspection process in the inspection apparatus 1. Note that the various kinds of programs for realizing the inspection process in the inspection apparatus 1 are those which have been recorded, for example, in a storage medium such as a computer-readable CD and installed from the storage medium to the control unit 50 for use.

Figure 3:
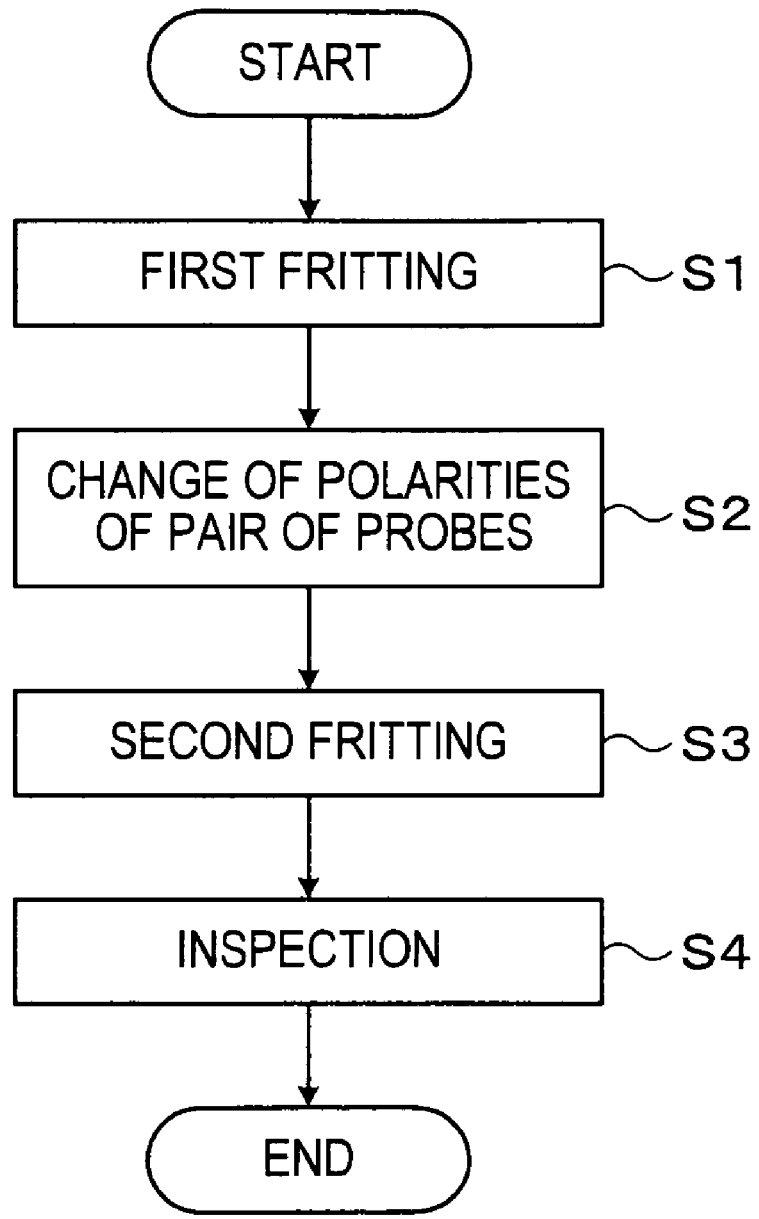
FIG. 3 is a flowchart of an inspection process.

Next, the inspection process of the electrical property of the wafer W performed in the inspection apparatus 1 configured as described above will be described. FIG. 3 is a flowchart of an inspection process in this embodiment.

First of all, the wafer W is suction-held on the spin chuck 3. The wafer W on the chuck 3 is raised by the moving mechanism 4, whereby the pair of probes 10a and 10b is brought into contact with each electrode P on the wafer W as shown in FIG. 2.

In this event, the fritting circuit 41 and the pair of probes 10a and 10b are electrically connected by the first switching circuit 42. By the second switching circuit 43, for example, the cathode terminal D1 of the fritting circuit 41 is connected to the probe 10a, and the anode terminal D2 of the fritting circuit 41 is connected to the probe 10b.

The fritting circuit 41 then applies, as shown in FIG. 4, for example, a voltage to present a potential gradient of, for example, about $10^5$ V/cm to about $10^6$ V/cm between the pair of probes 10a and 10b with the probe 10a having the negative polarity and the probe 10b having the positive polarity. This causes a fritting phenomenon to cause a dielectric breakdown of the oxide film on the surface of the electrode P to thereby establish an electrical conduction between the pair of probes 10a and 10b and the electrode P, thereby performing a first fritting step (Step S1 in FIG. 3). Note that in the fritting step, the voltage applied between the pair of probes 10a and 10b may be gradually increased and the fritting may be completed when it reaches a predetermined application voltage, or the current value flowing between the pair of probes 10a and 10b or its voltage value may be monitored and the fritting may be completed when the current value or voltage value reaches its target value.

After completion of the first fritting step S1, the second switching circuit 43 then connects the anode terminal D2 of the fritting circuit 41 to the probe 10a and connects the negative polarity D1 of the fritting circuit 41 to the probe 10b to thereby change the polarities of the voltage applied between the pair of probes 10a and 10b (Step S2 in FIG. 3).

The fritting circuit 41 then applies, as shown in FIG. 5, a voltage with reverse polarities to those in the first fritting step S1 between the pair of probes 10a and 10b such that the probe 10a has the positive polarity and the probe 10b has the negative polarity. This causes again the fritting phenomenon to establish an electrical conduction between the probes 10a and 10b and the electrode P, thereby performing a second fritting step (Step S3 in FIG. 3).

The first switching circuit 42 then electrically connects the inspection circuit 40 and the pair of probes 10a and 10b. An electrical signal for inspection is sent from the inspection circuit 40 to the pair of probes 10a and 10b so that the electrical property of the electronic circuit on the wafer W is inspected (Step S4 in FIG. 3).

After completion of the inspection of the electrical property of the wafer W, the chuck 3 is lowered and the wafer W is then removed from the chuck 3, with which a series of inspection process ends.

According to the above embodiment, the fritting step is performed twice with the polarities of the voltage applied between the pair of probes 10a and 10b changed, so that the electrical conduction between the pair of probes 10a and 10b and the electrode P on the wafer W can be stabilized. The effect of this embodiment is discussed hereinafter.

FIG. 6 shows a state of a tip portion of the probe on the anode side ((a) in FIG. 6) and a state of a tip portion of the probe on the cathode side ((b) in FIG. 6) when the fritting is performed a plurality of times without changing their polarities. In this experiment, the fritting was performed 2000 times with probes made of Pd (palladium) brought into contact with electrodes made of aluminum.

As shown in FIG. 6, more aluminum melt adheres to the probe on the cathode side than the probe on the anode side. It is conceivable that the more melt adheres, the contact force between the probe and the electrode is stronger during the fritting to present the electrical conduction, and therefore this experiment verifies that there is bias in electrical conductivity between the cathode and the anode of the probe pair between which the voltage is applied. Note that the combination between the electrode material and the probe material changes the electrode to which the amount of adhering melt to change the magnitudes of the conductivity of the cathode and the anode.

Based on the result of this experiment, an experiment was then carried out that compares the conductivity between the probe pair and the wafer W between the case where the fritting was performed only once (a conventional method), the case where the fritting was performed twice without changing the polarities, and the case where the fritting was performed twice with the polarities being changed.

FIG. 7 is a table showing the result of the experiment. In this experiment, three sets (I, II, and III in the table in FIG. 7) of inspection process were performed taking 6000 samples as one set in each of the above cases, and the quality of the electrical conductivity between the probe pair and the electrode was evaluated. FIG. 7 shows the numbers of samples whose conductivities were poor after performance of the first fritting and became good after performance of the second fritting, and the numbers of samples whose conductivities were poor even after performance of both the first and second fritting. Note that when the fritting is performed only once, the numbers of defective samples in the only one fritting are shown.

This result of the experiment shows that good conductivity may not be obtained finally when the fritting is performed twice without changing the polarities, whereas when the fritting is performed twice with the polarities being changed, the numbers of samples whose conductivities are finally poor are zero so that good conductivity is obtained for all of the samples. It is conceivable that this is because the above-described bias in the conductivities of the cathode and the anode of the probe pair is solved by performing the fritting with the polarities being changed.

According to the above result of the experiment, it can be verified that the electrical conduction between the pair of probes 10a and 10b and the electrode P is stabilized by changing the polarities of the voltage applied between the pair of probes 10a and 10b as in this embodiment. Consequently, according to this embodiment, the electrical conduction between the pair of probes 10a and 10b and the electrode P on the wafer W is stabilized to improve the reliability of inspection of the electrical property.

Figure 8:
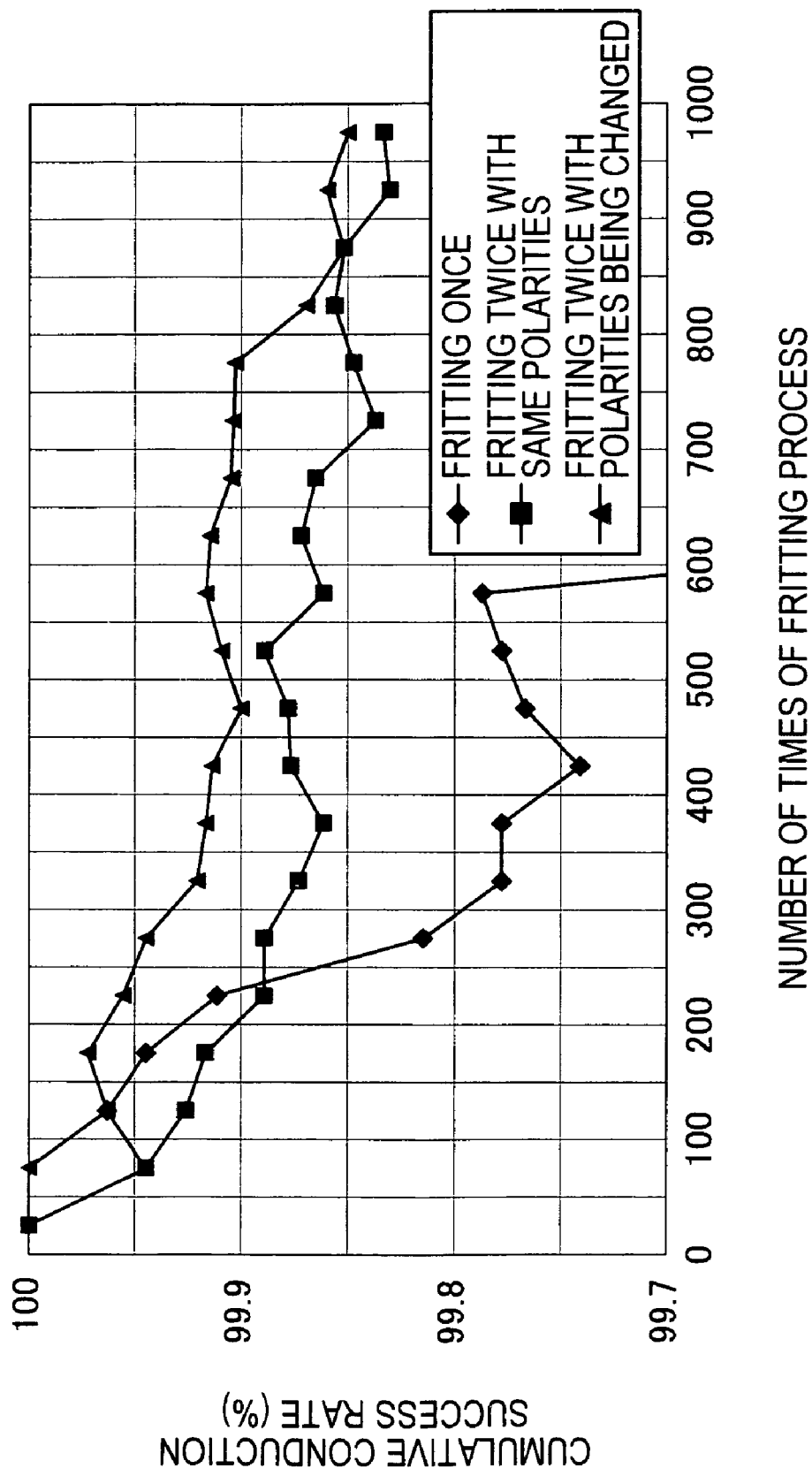
FIG. 8 is a graph showing the cumulative conduction success rate in each of the cases in FIG. 7.

According to the above-described embodiment, the lifetime of the pair of probes 10a and 10b can be increased. For example, FIG. 8 is a graph showing the cumulative conduction success rate in the case where the fritting is performed only once, the case where the fritting is performed twice without changing the polarities, and the case where the fritting is performed twice with the polarities being changed. The horizontal axis of the graph represents the number of times of fritting process in each of the above-described cases. According to this graph, a high conduction success rate can be maintained when the fritting is performed twice with the polarities being changed.

As one reason, it is conceivable that, for example, the melt of the electrode P does not intensively adhere to one of the probes of the probe pair, but the melt of the electrode P decentrally adheres to both the pair of probes 10a and 10b, so that the good conductivity of the probe pair is accordingly maintained for a long period. From the result, it can be verified that the lifetime of the pair of probes 10a and 10b is increased by changing the polarities of the voltage applied between the pair of probes 10a and 10b.

Note that though the number of times of fritting is two in the above embodiment, the number is not limited to two but may be three or more as long as it is plural. In this event, the numbers of the negative polarity and the positive polarity of the voltage applied between each pair of probes 10a and 10b are made the same to make the deterioration speed of the probe 10a and the probe 10b equal, whereby the lifetime of the pair of probes 10a and 10b can be further increased.

While the fritting is performed twice in the above embodiment, the electrical conductivity between the pair of probes 10a and 10b and the electrode P may be measured, for example, after the first fritting is performed, and the second fritting may be performed with the polarities being changed only when the measured electrical conductivity does not reach a predetermined reference.

Figure 9:
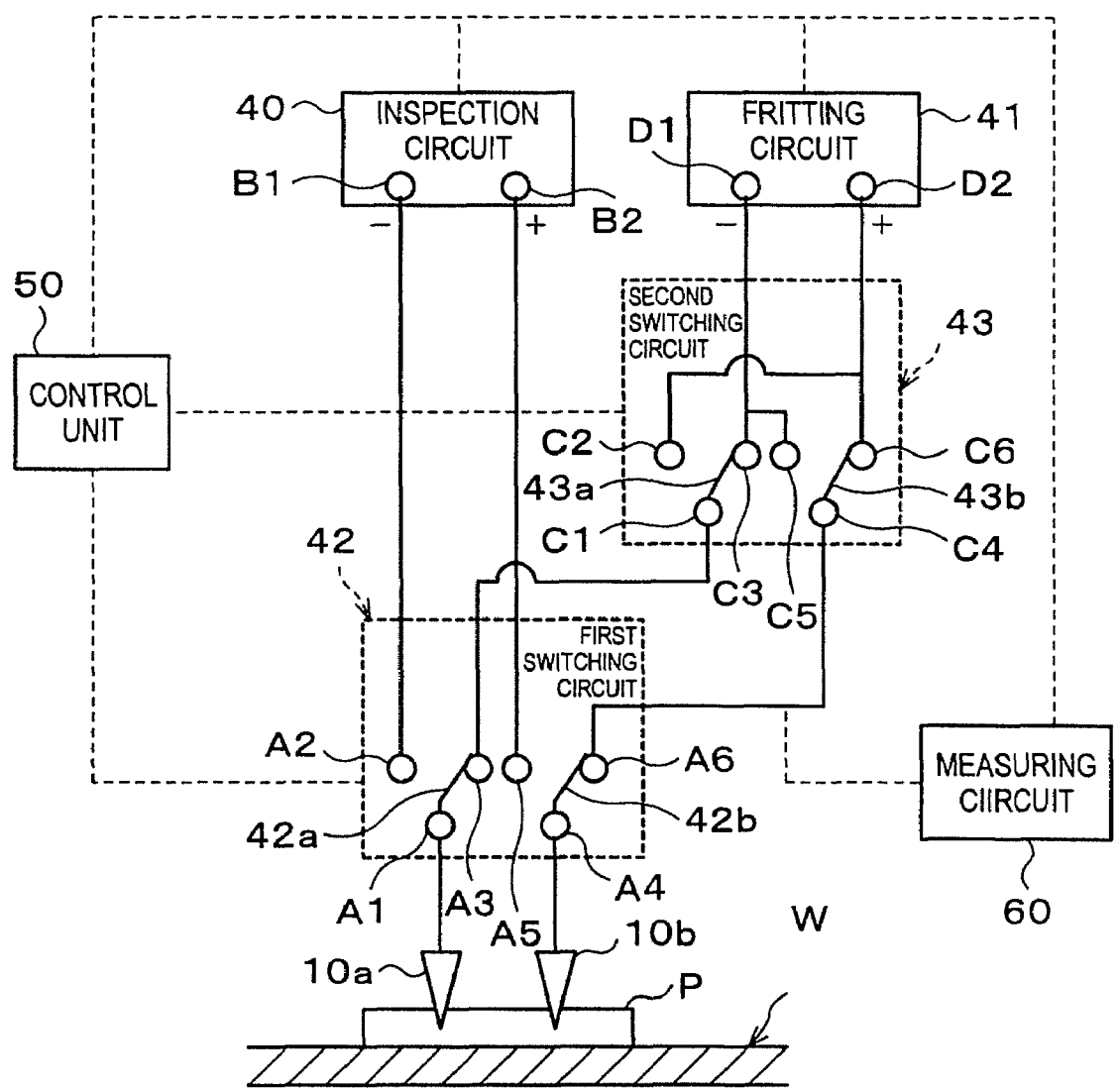
FIG. 9 is a schematic diagram showing a circuit configuration of a probe card with a measuring circuit.

In this case, a measuring circuit 60 is provided, for example, in the probe card 2 of the inspection apparatus 1 as shown in FIG. 9. The measuring circuit 60 is electrically connected between the fritting circuit 41 and the pair of probes 10a and 10b. The measuring circuit 60 can measure the electrical resistance as the electrical conductivity between the pair of probes 10a and 10b and the electrode P by applying a predetermined voltage between the pair of probes 10a and 10b in contact with the electrode P, and detecting the current flowing between the pair of probes 10a and 10b at that time. The measurement result of the electrical resistance can be outputted, for example, to the control unit 50, and the control unit 50 judges whether the electrical resistance is lower than a predetermined reference value, and executes the second fritting when the electrical resistance is not lower than the value.

Figure 10:
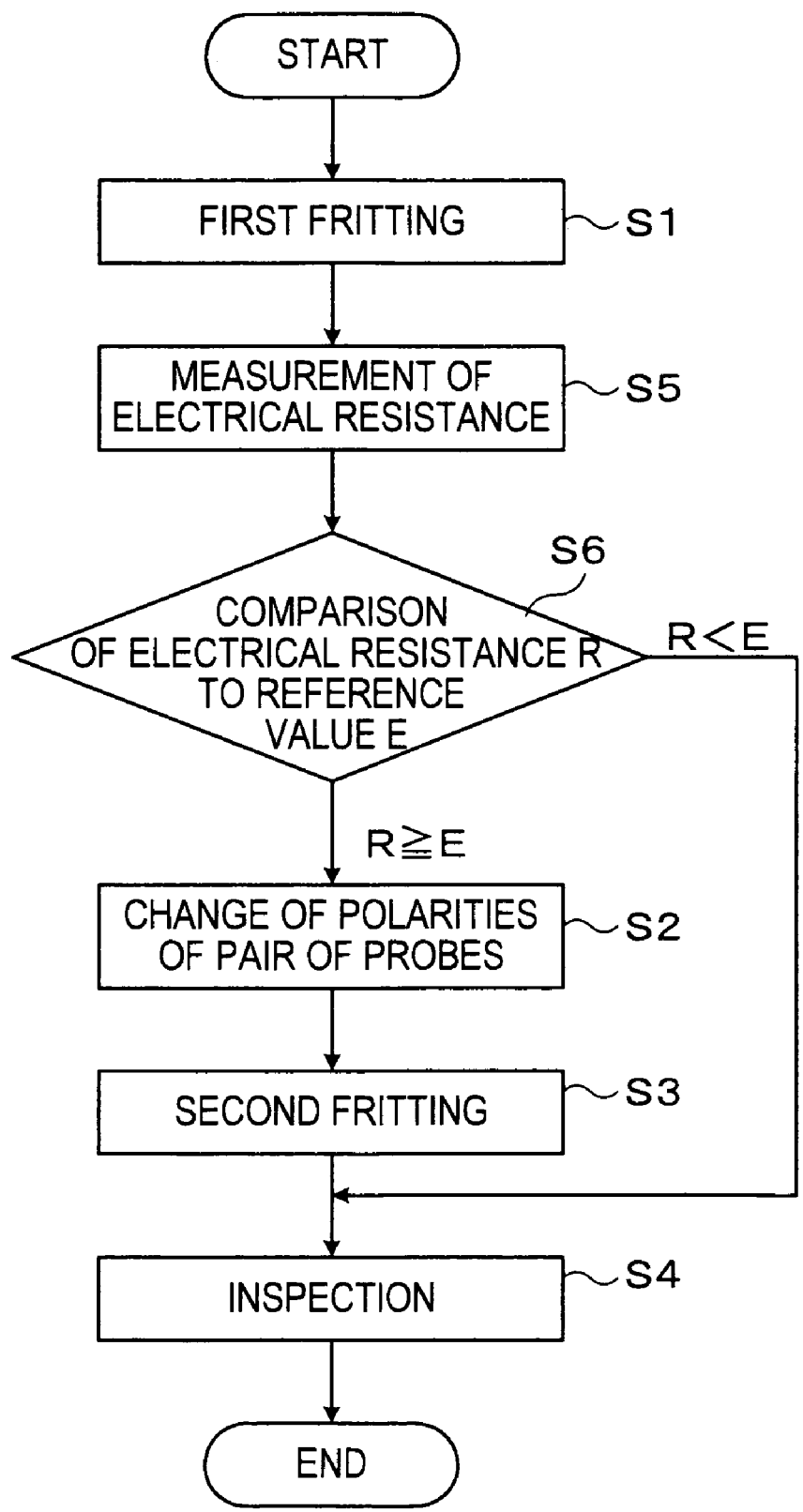
FIG. 10 is a flowchart of the inspection process when measuring the electrical resistance.

During the inspection process, as shown in FIG. 10, after completion of the first fritting, an electrical resistance R between the pair of probes 10a and 10b and the electrode P is measured by the measuring circuit 60 (Step S5 in FIG. 10). In the control unit 50, the electrical resistance R is compared to its reference value E (Step S6 in FIG. 10). If the electrical resistance R is higher than the reference value E, the second fritting is performed with the polarities being changed, and the inspection of the electrical property of the wafer W is then performed. If the measured electrical resistance R is lower than the reference value E, the inspection of the electrical property of the wafer W is performed without performing the second fritting.

According to this example, when the electrical resistance of the electrode P on the wafer W has not been made lower than the reference value by the first fritting, the second fritting is performed with the polarities being changed, thus ensuring that high conductivity between the pair of probes 10*a* and 10*b* and the electrode P is obtained as also described in the above embodiment. Further, if a desired conductivity has been obtained between the pair of probes 10*a* and 10*b* and the electrode P as a result of the first fritting, it is only necessary to perform the fritting once, so that the inspection process time can be accordingly reduced. Note that in this example, the fritting may be performed twice or more, the measurement of the electrical resistance of the electrode P may be performed after completion of the second or subsequent fritting, and a next fritting may be performed based on the measurement result.

While the electrical conductivity between the pair of probes 10*a* and 10*b* and the electrode P is verified after completion of the first fritting in the above example, the electrical conductivity may be verified during the first fritting. In this case, the current value flowing between the pair of probes 10*a* and 10*b* or its voltage value is monitored during the first fritting to verify the electrical conductivity between the pair of probes 10*a* and 10*b* and the electrode P. Then, the second fritting may be performed when a predetermined set voltage is applied between the pair of probes 10*a* and 10*b* but the measured current value or the measured voltage value does not reach its target value.

A preferred embodiment of the present invention has been described above with reference to the accompanying drawings, and the present invention is not limited to the embodiment. It should be understood that various changes and modifications within the scope of the spirit as set forth in claims are readily apparent to those skilled in the art, and those should also be covered by the technical scope of the present invention. For example, as the switching circuit 43 of the inspection apparatus 1 described in the above embodiment, an H bridge circuit may be employed. Further, the object to be inspected which is inspected in the inspection apparatus 1 described in the above embodiment may be other substrates other than the wafer W, such as an FPD (Flat Panel Display) and the like.

The present invention is useful in stabilizing the electrical conductivity between an object to be inspected and probes to improve the reliability of inspection.

What is claimed is:

1. An inspection method of inspecting an electrical property of an object to be inspected by bringing probes into contact with the object to be inspected, said method comprising:
    a fritting step of bringing a probe pair composed of probes in pairs into contact with the object to be inspected and applying a voltage between the probe pair to cause a fritting phenomenon to establish electrical conduction between the probes and the object to be inspected,
    wherein said fritting step further includes a step of applying a voltage between the probe pair a plurality of times and the step of alternately changing polarities of the voltage applied between the probe pairs.

2. The inspection method as set forth in claim 1,
    wherein said fritting step comprises a step of measuring an electrical conductivity between the probes and the object to be inspected after completion of an application of voltage between the probe pair, and
    wherein when the measured electrical conductivity does not reach a previously set reference, a subsequent application of voltage between the probe pair is performed with the polarities being changed.

3. The inspection method as set forth in claim 1,
    wherein the application of voltage the plurality of times between the probe pair is performed such that the numbers of times of a positive polarity and a negative polarity are the same for each of the probes.

4. An inspection apparatus inspecting an electrical property of an object to be inspected by bringing probes into contact with the object to be inspected, said apparatus comprising:
    a fritting circuit applying a voltage between a probe pair composed of probes in pairs in contact with the object to be inspected to cause a fritting phenomenon to establish an electrical conduction between the probes and the object to be inspected; and
    a switching circuit electrically connecting said probe pair and said fritting circuit and capable of freely switching between polarities of a voltage applied between said probe pair.

5. The inspection apparatus as set forth in claim 4, further comprising:
    a measuring circuit measuring an electrical conductivity between said probes and the object to be inspected using said probe pair.

6. A computer-readable storage medium storing a program running on a computer of a control unit controlling an inspection apparatus when an inspection method of inspecting an electrical property of an object to be inspected by bringing probes into contact with the object to be inspected is performed using the inspection apparatus,
    said inspection method comprising:
    a fritting step of bringing a probe pair composed of probes in pairs into contact with the object to be inspected and applying a voltage between the probe pair to cause a fritting phenomenon to establish electrical conduction between the probes and the object to be inspected,
    wherein said fritting step further includes a step of applying a voltage between the probe pair a plurality of times and the step of alternately changing polarities of the voltage applied between the probe pairs.

7. The computer-readable storage medium as set forth in claim 6,
    wherein said fritting step comprises a step of measuring an electrical conductivity between the probes and the object to be inspected after completion of an application of voltage between the probe pair, and
    wherein when the measured electrical conductivity does not reach a previously set reference, a subsequent application of voltage between the probe pair is performed with the polarities being changed.

8. The computer-readable storage medium as set forth in claim 6,
    wherein the application of voltage the plurality of times between the probe pair is performed such that the numbers of times of a positive polarity and a negative polarity are the same for each of the probes.

* * * * *